US012677413B2

(12) United States Patent
Chiu et al.

(10) Patent No.: US 12,677,413 B2
(45) Date of Patent: Jul. 7, 2026

(54) ONE-TIME PROGRAMMABLE (OTP) SEMICONDUCTOR DEVICE

(71) Applicant: UNITED MICROELECTRONICS CORP., Hsin-Chu City (TW)

(72) Inventors: Yung-Chen Chiu, Tainan City (TW); Chi-Horn Pai, Tainan City (TW); Sheng-Yuan Hsueh, Tainan City (TW); Kuo-Hsing Lee, Hsinchu County (TW); Chih-Kai Kang, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 870 days.

(21) Appl. No.: 17/869,752

(22) Filed: Jul. 20, 2022

(65) Prior Publication Data
US 2023/0422491 A1 Dec. 28, 2023

(30) Foreign Application Priority Data
Jun. 22, 2022 (CN) .......................... 202210714007.4

(51) Int. Cl.
*H10B 20/25* (2023.01)
(52) U.S. Cl.
CPC .................................... *H10B 20/25* (2023.02)
(58) Field of Classification Search
CPC .................................................... H10B 20/25
See application file for complete search history.

(56) References Cited

U.S. PATENT DOCUMENTS

| | | | |
|---|---|---|---|
| 6,130,469 A | 10/2000 | Bracchitta et al. | |
| 9,589,970 B1 * | 3/2017 | Tseng ..................... | H10B 20/25 |
| 9,659,943 B1 * | 5/2017 | Tran ..................... | H10D 30/696 |
| 2015/0016174 A1 * | 1/2015 | Liu ..................... | H01L 23/5252 |
| | | | 365/96 |
| 2015/0123209 A1 * | 5/2015 | Choi ..................... | H10D 62/116 |
| | | | 257/379 |
| 2016/0104704 A1 * | 4/2016 | Fang ..................... | H10D 84/038 |
| | | | 438/275 |
| 2018/0277546 A1 | 9/2018 | Wang | |
| 2021/0343695 A1 * | 11/2021 | Chiu ..................... | H01L 23/5256 |

FOREIGN PATENT DOCUMENTS

CN          102376753 A          3/2012

* cited by examiner

*Primary Examiner* — Yara B Green
*Assistant Examiner* — Christopher M Roland
(74) *Attorney, Agent, or Firm* — Winston Hsu

(57) ABSTRACT

A method for fabricating a semiconductor device includes the steps of first providing a substrate comprising an one time programmable (OTP) device region, forming a shallow trench isolation (STI) in the substrate, removing part of the STI to form a first step on a corner of the substrate, forming a first gate oxide layer on the substrate, removing the first gate oxide layer to form a second step on the corner of the substrate, forming a second gate oxide layer on the substrate, and then forming a first gate structure on the substrate and the STI.

8 Claims, 7 Drawing Sheets

ONE-TIME PROGRAMMABLE (OTP) SEMICONDUCTOR DEVICE

BACKGROUND OF THE INVENTION

1. Field of the Invention

The invention relates to a method for fabricating semiconductor device, and more particularly to a method for fabricating an one-time programmable (OTP) device.

2. Description of the Prior Art

Semiconductor memory devices including non-volatile memory devices have been widely used in various electronic devices such as cellular phones, digital cameras, personal digital assistants (PDAs), and other applications. Typically, non-volatile memory devices include multi-time programmable (MTP) memory devices and one-time programmable (OTP) memory devices. In contrast to rewritable memories, OTP memory devices have the advantage of low fabrication cost and easy storage. However, OTP memory devices could only perform a single data recording action such that when certain memory cells of a destined storage block were stored with a writing program, those memory cells could not be written again.

Since current OTP memory devices still have the disadvantage of weak reading current and longer stress time under program mode, how to improve the current architecture for OTP memory devices has become an important task in this field.

SUMMARY OF THE INVENTION

According to an embodiment of the present invention, a method for fabricating a semiconductor device includes the steps of first providing a substrate comprising an one time programmable (OTP) device region, forming a shallow trench isolation (STI) in the substrate, removing part of the STI to form a first step on a corner of the substrate, forming a first gate oxide layer on the substrate, removing the first gate oxide layer to form a second step on the corner of the substrate, forming a second gate oxide layer on the substrate, and then forming a first gate structure on the substrate and the STI.

According to another aspect of the present invention, a semiconductor device includes a substrate having an one time programmable (OTP) device region, a shallow trench isolation (STI) in the substrate, and a gate structure on the STI. Preferably, the substrate directly under the gate structure and adjacent to the STI includes a first step and a second step.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-6 illustrate a method for fabricating a semiconductor device according to an embodiment of the present invention.

DETAILED DESCRIPTION

Figure 1:
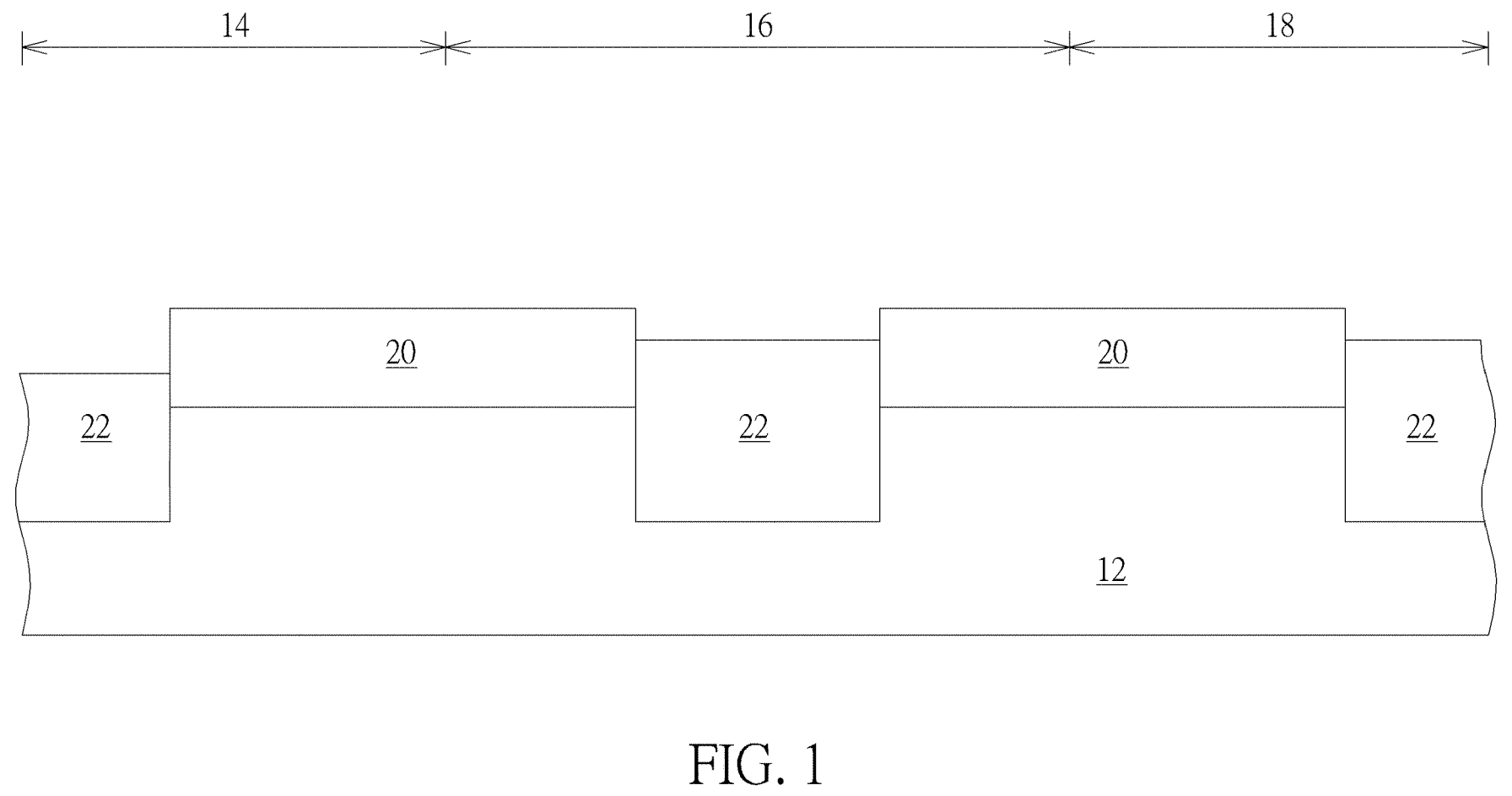
Figure 2:
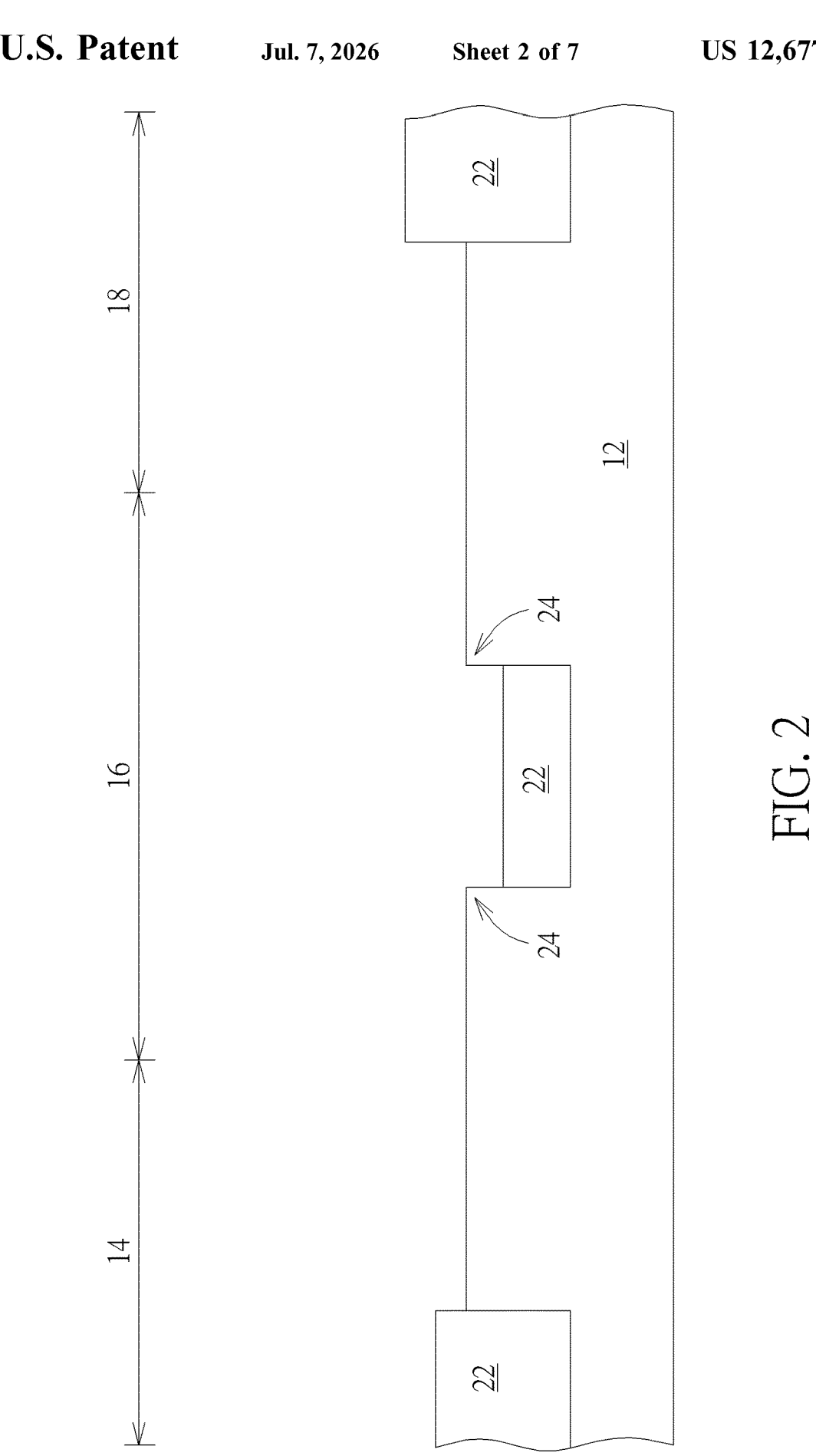

Referring to FIGS. 1-6, FIGS. 1-6 illustrate a method for fabricating a semiconductor device according to an embodiment of the present invention. As shown in FIG. 1, a substrate 12 such as a silicon substrate or silicon-on-insulator (SOI) substrate is provided and an input/output (I/O) region 14, an one time programmable (OTP) device region 16, and a core region 18 are defined on the substrate 12, in which the OTP device region 16 could further include a cell region (not shown) and a periphery region (not shown) and the top surface of the substrate 12 could include a liner 20 made of silicon nitride. Next, a shallow trench isolation (STI) 22 is formed in the substrate 12 to divide the aforementioned regions and an ion implantation process could be conducted to implant p-type or n-type dopants into the substrate 12 for forming a well region in each of the above regions in the substrate 12. In this embodiment, the I/O region 14 and the core region 18 are defined to fabricate metal-oxide semiconductor (MOS) transistors in the later process while the OTP region 16 is defined to fabricate an integrated structure of MOS transistors and OTP capacitors.

It should be noted that since part of the STI 22 on the core region 18 would be slightly removed during removal of gate oxide layer in the later process, it would be desirable to conduct an extra photo-etching process to remove part of the STI 22 on the I/O region 14 before forming the well region so that the top surface of the STI 22 on the I/O region 14 is slightly lower than the top surface of the STI 22 on the OTP device region 16 and core region 18 while the top surfaces of the STI 22 on the OTP device region 16 and core region 18 are coplanar.

Next, as shown in FIG. 2, an etching process could be conducted to remove the liner 20 and then a photo-etching process is conducted by first forming a patterned mask (not shown) such as patterned resist on the I/O region 14 and core region 18 to expose the substrate 12 and STI 22 on the OTP device region 16, and then using the patterned mask as mask to remove part of the STI 22 on the OTP device region 16 through etching so that the top surface of the remaining STI 22 is slightly lower than the top surface of the substrate 12 on two adjacent sides. In the same time, a step 24 or step portion is formed at the corner of the substrate 12 immediately adjacent to and slightly higher than the STI 22.

It should be noted that the etching process conducted at this stage preferably includes diluted hydrofluoric acid (dHF) and sulfuric acid-hydrogen peroxide mixture (SPM) as etching agent, in which dHF removes part of the STI 22 while SPM removes the patterned resist. Since the utilization of SPM for removing the patterned resist may oxidize part of the substrate 12, an oxide layer (not shown) made of silicon oxide could be formed on the top surface and sidewalls of the substrate 12 on the OTP device region 16 after part of the STI 22 is removed.

Moreover, only part of the STI 22 on the OTP device region 16 is removed at this stage while none of the STI 22 on the I/O region 14 and core region 18 is removed by the etching process hence after the photo-etching process, the top surface of the STI 22 on the OTP device region 16 is not only lower than the top surface of the substrate 12 on the I/O region 14, OTP device region 16, and core region 18 but also lower than the top surface of the STI 22 on the I/O region 14 and core region 18.

Figure 3:
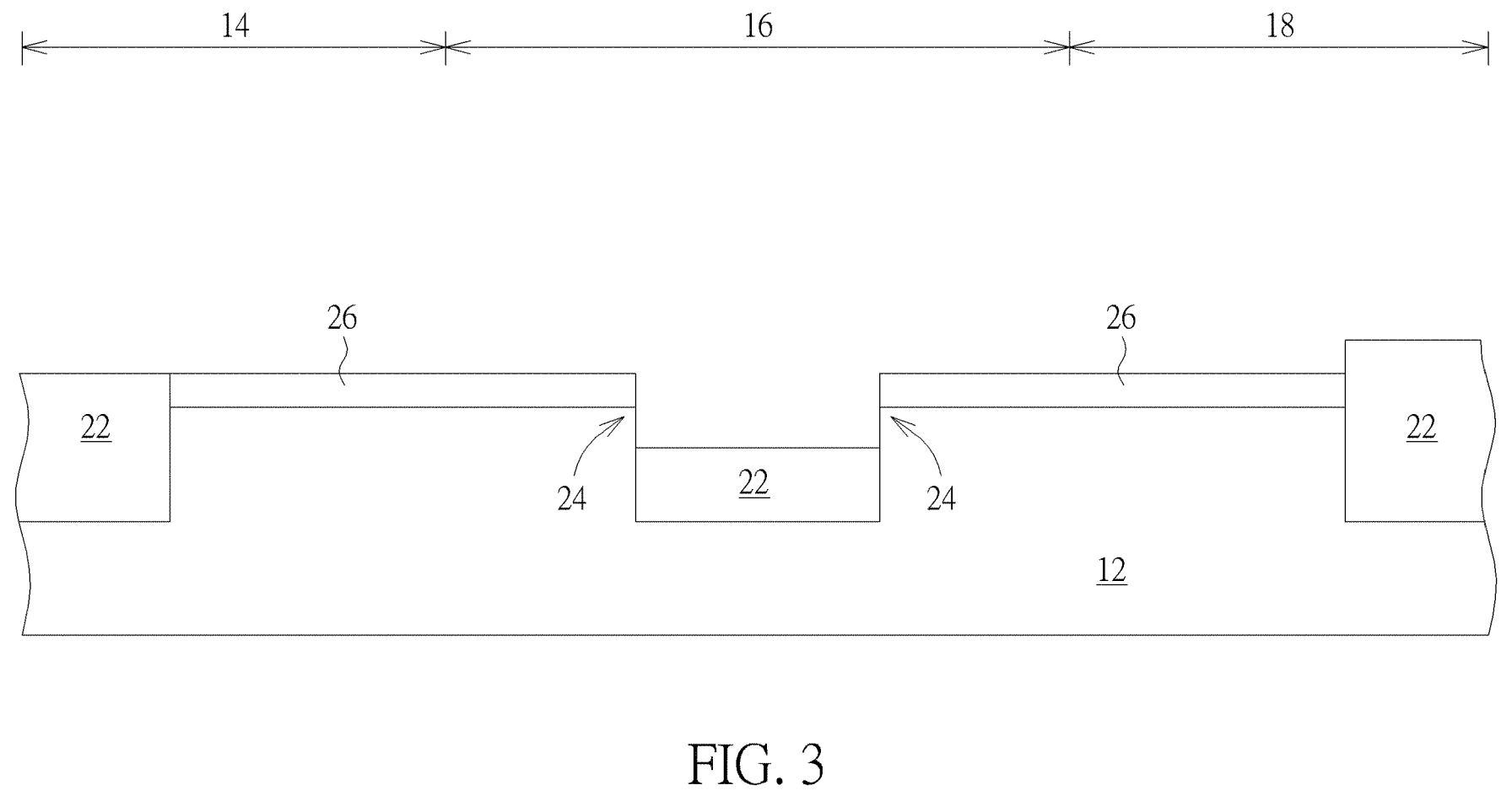

Next, as shown in FIG. 3, an oxide growth process such as a rapid thermal oxidation (RTO) process is conducted to form a thick gate oxide layer 26 made of silicon oxide on the substrate 12 of I/O region 14, OTP device region 16, and core region 18, in which the top surface of the gate oxide layer 26 could be even with the top surface of the STI 22 on the I/O region 14 and slightly lower than the top surface of the STI 22 on the core region 18. Preferably, the thickness of the gate oxide layer 26 on the I/O region 14, OTP device region 16, and core region 18 is between 55-65 Angstroms or most preferably 58 Angstroms.

Figure 4:
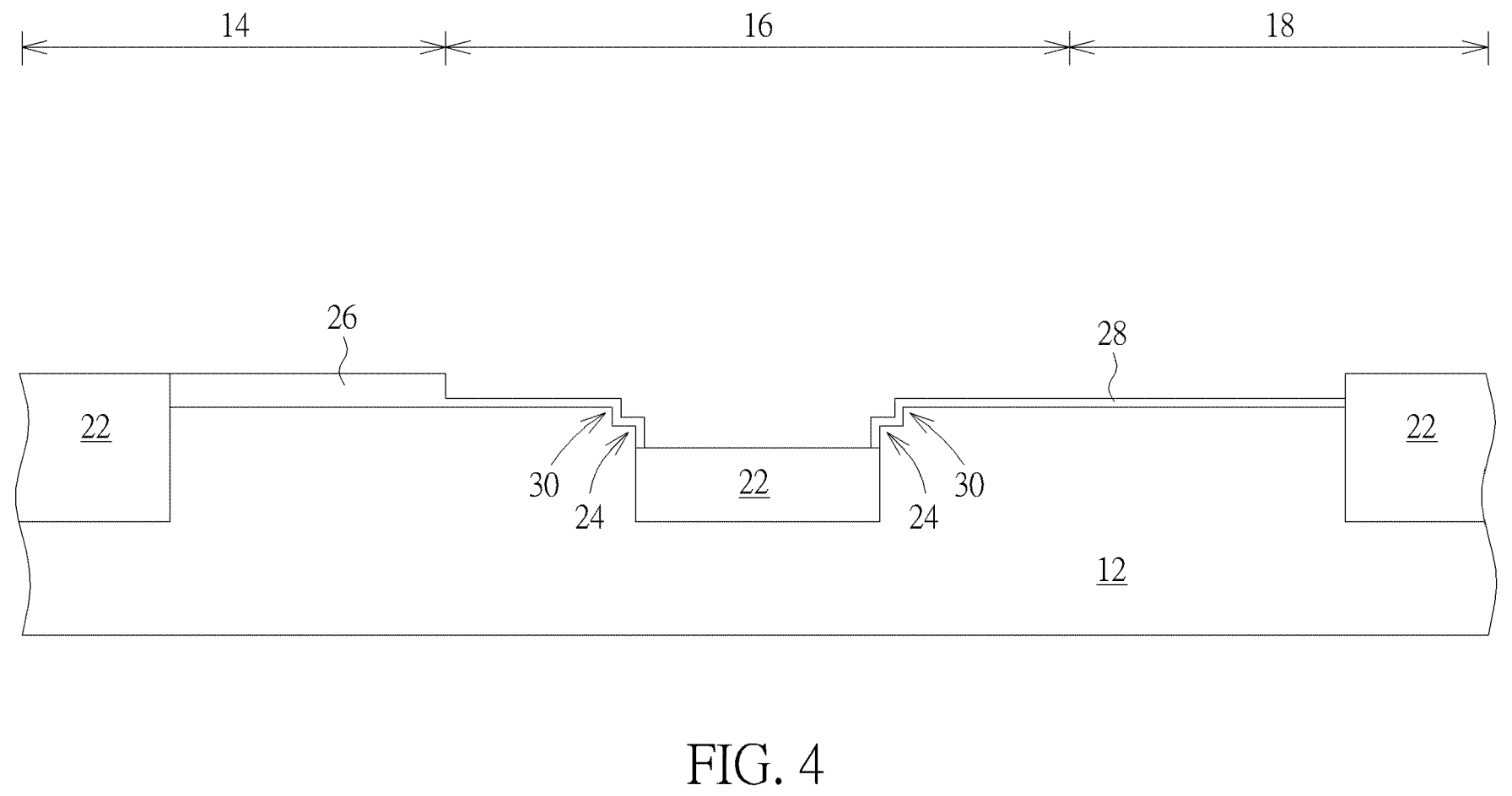

Next, as shown in FIG. 4, a photo-etching process could be conducted by forming a patterned mask (not shown) such as patterned resist on the I/O region 14 and exposing the substrate 12 and STI 22 on the OTP device region 16 and core region 18, using the patterned mask as mask to remove the gate oxide layer 26 on both OTP device region 16 and core region 18, and then removing the patterned mask thereafter. Specifically, the etching process conducted at this stage preferably includes diluted hydrofluoric acid (dHF) and sulfuric acid-hydrogen peroxide mixture (SPM) as etching agent, in which the dHF removes the gate oxide layer 26 while the SPM removes the patterned resist. Since the utilization of SPM for removing the patterned resist may oxidize part of the substrate 12, a thin oxide layer or gate oxide layer 28 made of silicon oxide could be formed on the surface of the substrate 12 on both OTP device region 16 and core region 18 after the thicker gate oxide layer 26 on regions 16, 18 are removed. At the same time, the sidewall of the substrate 12 higher than the top surface of STI 22 on regions 16, 18 would be slightly retracted inward to form another step 30 or step portion. In other words, after removing the thicker gate oxide layer 26 as shown in FIG. 3, two steps 24, 30 are formed on the corners of the substrate 12 immediately adjacent to the STI 22 on the OTP device region 16 and at the same time a thinner gate oxide layer 28 is formed on the surface of the two steps 24, 30. In this embodiment, the thickness of the gate oxide layer 28 is preferably between 4-6 Angstroms or most preferably 5 Angstroms.

It should also be noted that when the gate oxide layer 26 on the OTP device region 16 and core region 18 is removed, part of the STI 22 on the core region 18 immediately adjacent to the gate oxide layer 26 in particular is also removed so that the overall height of the STI 22 is slightly reduced. Since a patterned mask was disposed on the I/O region 14, the height of the STI 22 on the I/O region 14 was not affected during the etching process. Nevertheless, because part of the STI 22 on the I/O region 14 is removed in the beginning before forming the well region as shown in FIG. 1, the top surface of the STI 22 on the core region 18 after being slightly removed at this stage would be even with the top surface of the STI 22 on the I/O region 14.

Figure 5:
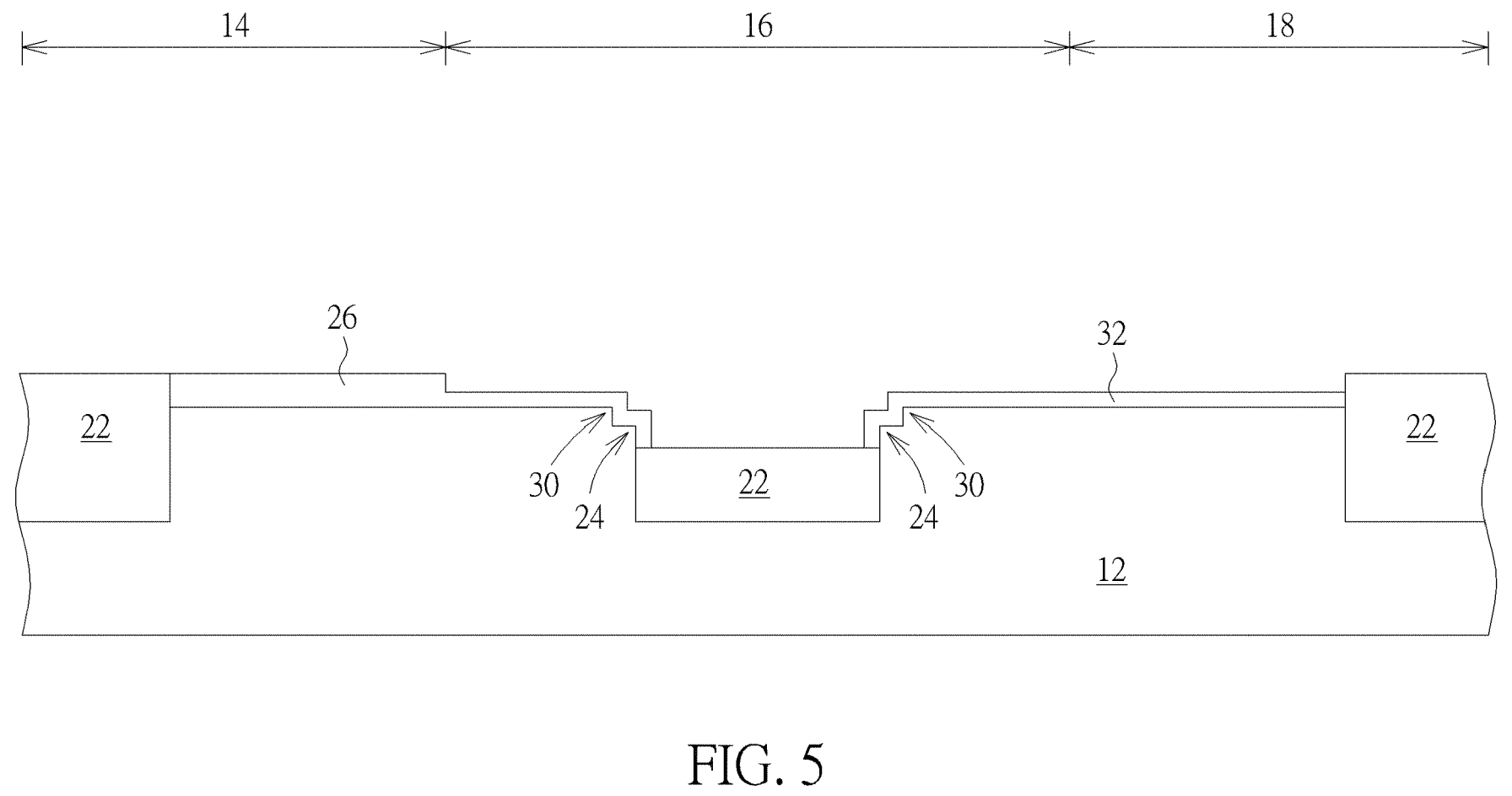

Next, as shown in FIG. 5, an oxidation process such as an in-situ steam generation (ISSG) process is conducted to form a gate oxide layer on the surface of the substrate 12 on both OTP device region 16 and core region 18. Preferably, newly formed gate oxide layer is formed directly on the previous gate oxide layer 28 formed on the OTP device region 16 and core region 18 as shown in FIG. 4 and the new gate oxide layer and the previously formed gate oxide layer 28 are combined into a new gate oxide layer 32. According to a preferred embodiment of the present invention, the overall thickness of the new gate oxide layer 32 formed at this stage on the OTP device region 16 and core region 18 is approximately 8-12 Angstroms or most preferably 10 Angstroms.

Figure 6:
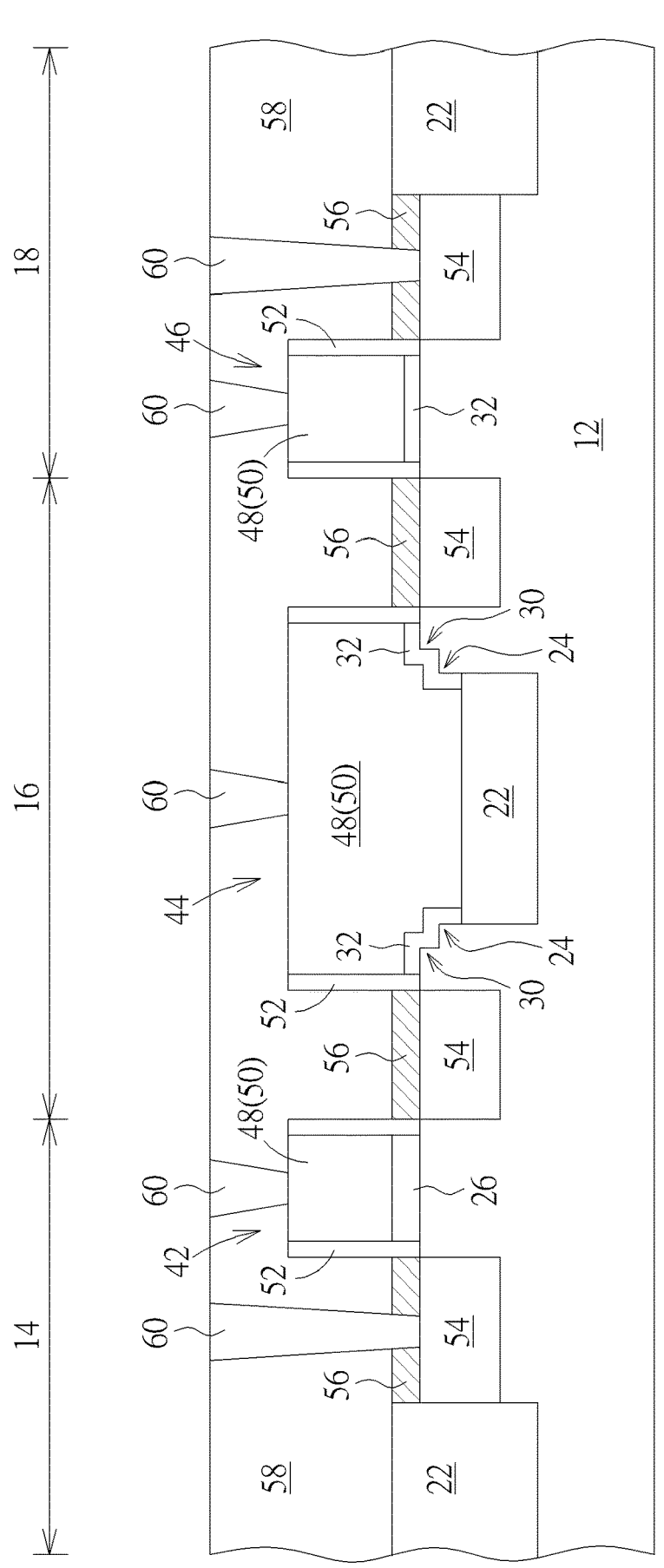

Next, as shown in FIG. 6, a gate formation process could be conducted to form gate structures 42, 44, 46 on each of the regions 14, 16, 18, in which the gate structure 46 on the right side and the gate structure 44 in the middle or the gate structure 42 on the left side and the gate structure 44 in the middle could be formed to constitute a 1 transistor-1 capacitor (1T1C) combination of an OTP device.

In this embodiment, the formation of the gate structures 42, 44, 46 could be accomplished by a gate first process, a high-k first approach from gate last process, or a high-k last approach from gate last process. Since this embodiment pertains to a high-k first approach, a gate material layer 48 made of polysilicon and a selective hard mask (not shown) could be formed sequentially on the gate oxide layers, 26, 32 on the regions 14, 16, 18, and a pattern transfer process is then conducted by using a patterned resist (not shown) as mask to remove part of the gate material layer 48 and part of the gate oxide layers 26, 32 through single or multiple etching processes. After stripping the patterned resist, gate structures 42, 44, 46 made of patterned gate oxide layers 26, 32 and patterned gate material layers 48 are formed on the substrate 12. Preferably, the patterned gate material layer 48 now serves as a gate electrode 50 in each of the gate structures 42, 44, 46.

Next, at least a spacer 52 is formed on the sidewalls of the gate structures 42, 44, 46, a source/drain region 54 and/or epitaxial layer (not shown) is formed in the substrate 12 adjacent to two sides of the spacers 52, and a selective silicide layer 56 could be formed on the surface of the source/drain regions 54. In this embodiment, each of the spacers 52 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source/drain regions 54 could include n-type dopants or p-type dopants depending on the type of device being fabricated.

Next, a contact etch stop layer (CESL) (not shown) is formed on the substrate 12 surface and the gate structures 42, 44, 46, and an interlayer dielectric (ILD) layer 58 is formed on the CESL afterwards. Next, a photo-etching process is conducted by using a patterned mask (not shown) as mask to remove part of the ILD layer 58 for forming contact holes (not shown) exposing the source/drain regions 54. Next, conductive materials including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact holes, and a planarizing process such as chemical mechanical polishing (CMP is conducted to remove part of aforementioned barrier layer and metal layer for forming contact plugs 60 electrically connecting the source/drain regions 54 and the gate structures 42, 44, 46.

Referring again to FIG. 6, FIG. 6 further illustrates a structural view of a semiconductor device according to an embodiment of the present invention. As shown in FIG. 6, the semiconductor device preferably includes an OTP device disposed on the OTP device region 16 and at least a transistor disposed on the I/O region 14 and/or the core region 18 respectively, in which the 1T1C architecture of the OTP device in this embodiment includes a capacitor disposed on the STI 22 on OTP device region 16 and a transistor disposed on the substrate 12 immediately adjacent to the STI 22 either on the I/O region 14 or core region 18. Specifically, the capacitor from the OTP device includes a gate structure 44 disposed on the STI 22, the transistor on the core region 18 includes a gate structure 46 disposed on the substrate 12 adjacent to right side of the STI 22, and the transistor on the I/O region 14 includes a gate structure 42 disposed on the substrate 12 adjacent to left side of the STI 22, a spacer 42 is adjacent to sidewalls of each of the gate structures 42, 44, 46, source/drain regions 54 are disposed in the substrate 12 adjacent to two sides of the gate structures 42, 44, 46, an ILD layer 58 is disposed around the gate structures 42, 44, 46, and contact plugs 60 are disposed in the ILD layer 58 to electrically connect the source/drain regions 54 and/or the gate structures 42, 44, 46. Preferably, the contact plugs 60 connecting the source/drain regions 54 are bit lines, the contact plugs 60 connecting the gate structures 42, 46 are word lines, and the contact plug 60 in the middle connecting the gate structure 44 of the capacitor is a source line.

In the capacitor of the OTP device, the surface of the substrate 12 directly under the gate structure 44 and adjacent to two sides of the STI 22 each includes a step 24 and a step 30. Since the surface profile of the substrate 12 between the STI 22 and the source/drain region 54 includes the two steps 24 and 30, the gate oxide layer 32 disposed on the substrate 12 surface adjacent to two sides of the STI 22 also includes the same two step profile, in which one sidewall of the gate oxide layer 32 is aligned with the sidewall of the gate electrode 50 atop while the other sidewall of the gate oxide layer 32 is disposed on and directly contacting the top surface of the STI 22. Alternatively, the other sidewall of the gate oxide layer 32 could be aligned with the sidewall of the STI 22 according to other embodiment of the present invention. For instance, left sidewall of the left gate oxide layer 32 could be aligned with the left sidewall of the gate electrode 50 while right sidewall of the left gate oxide layer 32 could directly contacting the top surface of the STI 22 or aligned with left sidewall of the STI 22. Similarly, right sidewall of the right gate oxide layer 32 could be aligned with the right sidewall of the gate electrode 50 while left sidewall of the right gate oxide layer 32 could directly contacting the top surface of the STI 22 or aligned with right sidewall of the STI 22, which are all within the scope of the present invention.

Figure 7:
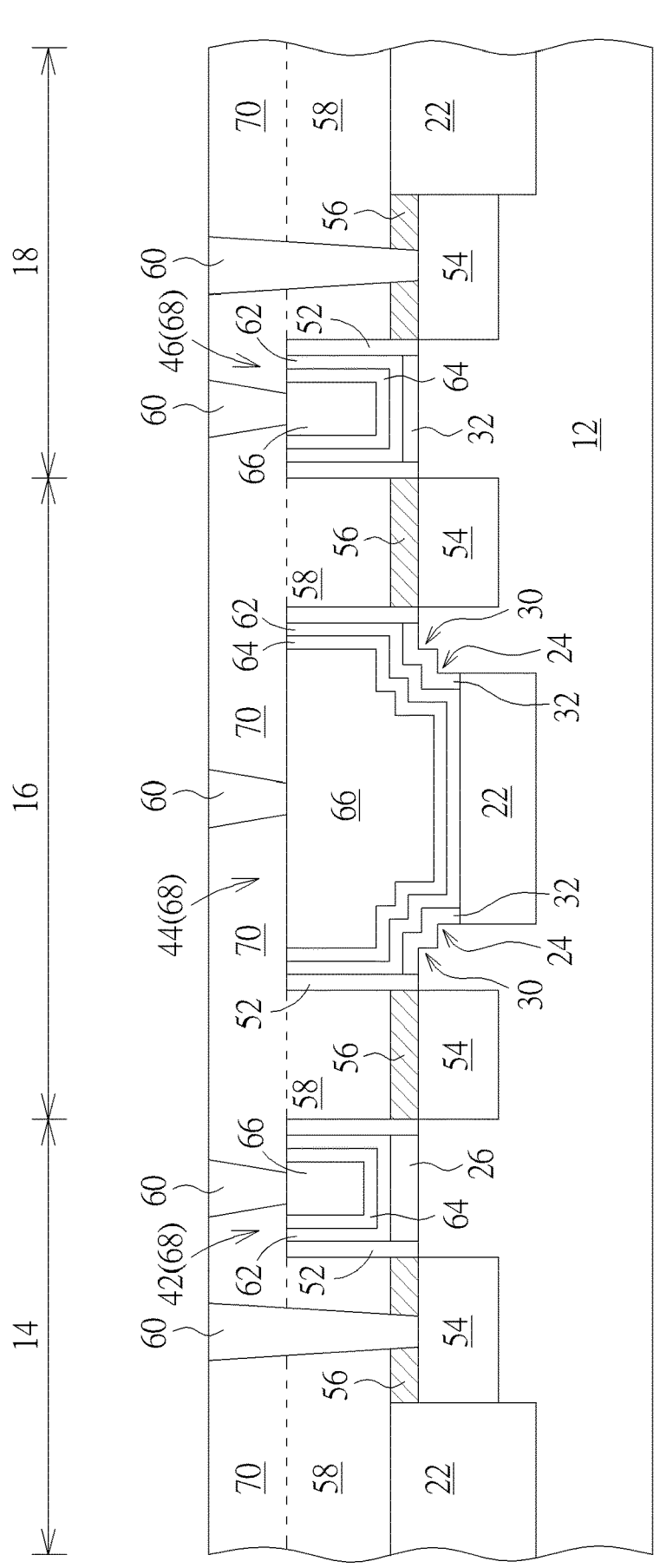
FIG. 7 illustrates a structural view of a semiconductor device according to an embodiment of the present invention.

Referring to FIG. 7, FIG. 7 illustrates a structural view of a semiconductor device according to an embodiment of the present invention. As shown in FIG. 7, in contrast to the gate structures 42, 44, 46 in the aforementioned embodiment are made of polysilicon, it would be desirable to conduct a replacement metal gate (RMG) process to transform the gate structures 42, 44, 46 into metal gates after forming the ILD layer 58 and before forming the conduct plugs 60. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 48 from gate structures 42, 44, 46 for forming a recess (not shown) in the ILD layer 58. Next, a high-k dielectric layer 62, a work function metal layer 64, and a low resistance metal layer 66 are formed in the recesses, and a planarizing process such as CMP is conducted to remove part of low resistance metal layer 66, part of work function metal layer 64, and part of high-k dielectric layer 62 to form metal gates 68.

If a high-k last approach were conducted to transform the polysilicon gate structure into metal gate such as the metal gate 68 from the OTP device disposed on the STI 22 for example, the gate structure 44 or metal gate 68 would include two gate oxide layers 32 disposed on the STI 22 on two adjacent sides, a U-shape high-k dielectric layer 62, a U-shape work function metal layer 64, and a low resistance metal layer 66. In contrast to only the gate oxide layer 32 from previous embodiment includes two steps 24, 30, the high-k dielectric layer 62 from the gate structure 44 of this embodiment also includes two steps 24, 30 or step portions. Moreover, the bottom surface of the high-k dielectric layer 62 in the gate structure 44 preferably contacts the STI 22 directly and lower than the bottom surface of the high-k dielectric layer 62 in the gate structures 42, 46 while the top surface of the high-k dielectric layer 62 in the gate structure 44 is even with the top surface of the high-k dielectric layer 62 in the gate structures 42, 46.

According to an embodiment of the present invention, the high-k dielectric layer 62 is preferably selected from dielectric materials having dielectric constant (k value) larger than 4. For instance, the high-k dielectric layer may be selected from hafnium oxide ($HfO_2$), hafnium silicon oxide (HfSiO$_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

The work function metal layer 64 is formed for tuning the work function of the metal gate in accordance with the conductivity of the device. For an NMOS transistor, the work function metal layer 64 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 64 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 64 and the low resistance metal layer 66 may include titanium (Ti), titanium nitride (TiN), tantalum (Ta) or tantalum nitride (TaN). Furthermore, the material of the low-resistance metal layer 66 may include copper (Cu), aluminum (Al), titanium aluminum (TiAl), cobalt tungsten phosphide (CoWP) or any combination thereof. Since the transformation of dummy gates into metal gates through RMG process is well known to those skilled in the art, the details of which are not explained herein for the sake of brevity.

Next, another ILD layer 70 could be formed on the ILD layer 58 and the metal gate 68 and a pattern transfer process such as the one shown in FIG. 6 could be conducted by first using a patterned mask (not shown) to remove part of the ILD layers 58, 70 for forming a plurality of contact holes (not shown) exposing the source/drain regions 54 and the gate structures 42, 44, 46. Next, conductive materials including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact holes, and a planarizing process such as chemical mechanical polishing (CMP is conducted to remove part of aforementioned barrier layer and metal layer for forming contact plugs 60 electrically connecting the source/drain regions 54 and the gate structures 42, 44, 46.

Overall, the present invention preferably conducts a series of oxidation process and etching treatments during integration of I/O device, OTP device, and core device to form dual step-shape profiles on the substrate surface adjacent to two sides of the STI and under the gate structure on the OTP device region and because of these step portions, the gate oxide layer and/or high-k dielectric layer disposed on the substrate also include two corresponding step portions. According to a preferred embodiment of the present invention, the formation of these step-shape features on the substrate surface or gate oxide layer adjacent to two sides of the STI could provide higher and more concentrated electrical field on the corner of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate comprising a one time programmable (OTP) device region;
a shallow trench isolation (STI) in the substrate;
a first gate structure on the STI, wherein the first gate structure comprises a first gate oxide layer on the substrate; and
a first step and a second step between the substrate and the first gate oxide layer and directly under the first gate structure, wherein both the first step and the second step are directly under the first gate oxide layer and higher than a top surface of the STI.

2. The semiconductor device of claim 1, wherein the substrate comprises an input/output (I/O) region, the OTP device region, and a core region, the semiconductor device further comprising:

the first gate structure on the OTP device region; and
a second gate structure on the I/O region.

3. The semiconductor device of claim 2, wherein the first gate structure comprises:
the first gate oxide layer on the substrate of the OTP device region;
a first high-k dielectric layer on first gate oxide layer;
a first work function metal (WFM) layer on the first high-k dielectric layer; and
a first low resistance metal layer on the first WFM layer.

4. The semiconductor device of claim 3, wherein the second gate structure comprises:
a second gate oxide layer on the substrate of the I/O region;
a second high-k dielectric layer on the second gate oxide layer;
a second work function metal (WFM) layer on the second high-k dielectric layer; and
a second low resistance metal layer on the second WFM layer.

5. The semiconductor device of claim 4, wherein a bottom surface of the first high-k dielectric layer is lower than a bottom surface of the second high-k dielectric layer.

6. The semiconductor device of claim 4, wherein a top surface of the first high-k dielectric layer is even with a top surface of the second high-k dielectric layer.

7. The semiconductor device of claim 3, wherein the first high-k dielectric layer comprises a third step and a fourth step on the substrate adjacent to the STI.

8. The semiconductor device of claim 3, wherein the first gate oxide layer comprises a fifth step and a sixth step on the substrate adjacent to the STI.

* * * * *